(12) United States Patent
Ahn et al.

(10) Patent No.: US 8,221,180 B2
(45) Date of Patent: Jul. 17, 2012

(54) ORGANIC LIGHT EMITTING DEVICE AND MANUFACTURING METHOD THEREOF

(75) Inventors: Byung Chul Ahn, Seoul (KR); Jeong Hyun Kim, Gyeonggi-do (KR); Heung Lyul Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 107 days.

(21) Appl. No.: 12/898,566

(22) Filed: Oct. 5, 2010

(65) Prior Publication Data
US 2011/0027923 A1 Feb. 3, 2011

Related U.S. Application Data

(62) Division of application No. 11/819,953, filed on Jun. 29, 2007, now Pat. No. 7,839,082.

(30) Foreign Application Priority Data

Jun. 30, 2006 (KR) .................. 10-2006-0060471

(51) Int. Cl.
*H01J 9/00* (2006.01)
(52) U.S. Cl. ................ 445/25; 445/43; 445/44
(58) Field of Classification Search .............. None
See application file for complete search history.

(56) References Cited

U.S. PATENT DOCUMENTS

| | | | |
|---|---|---|---|
| 7,417,370 B2 | 8/2008 | Cok et al. | |
| 7,436,114 B2 | 10/2008 | Wang et al. | |
| 7,696,688 B2 | 4/2010 | Kim | |
| 2005/0258745 A1 | 11/2005 | Tsujimura et al. | |
| 2006/0199461 A1* | 9/2006 | Yamazaki et al. | 445/24 |

* cited by examiner

*Primary Examiner* — Ashok Patel
(74) *Attorney, Agent, or Firm* — Morgan, Lewis & Bockius LLP

(57) ABSTRACT

An organic light emitting device and a manufacturing method thereof are provided. The organic light emitting device includes a first display substrate, a second display substrate, and a first adhesive force improving member. The first display substrate includes a first substrate, a first electrode, organic light emitting patterns, a first spacer, and a second electrode. The first electrode is formed on an entire surface of the first substrate, and the organic light emitting patterns are disposed on the first electrode. The first spacer corresponds to the organic light emitting pattern and is disposed on the first electrode. The second electrode covers the organic light emitting patterns and the first spacer. The second display substrate includes a second substrate, and a first driving signal delivery part. The first adhesive force improving member electrically/physically couples the second electrode to the first driving signal delivery part.

5 Claims, 7 Drawing Sheets

ORGANIC LIGHT EMITTING DEVICE AND MANUFACTURING METHOD THEREOF

This is a divisional of U.S. patent application Ser. No. 11/819,953, filed Jun. 29, 2007 now U.S. Pat. No. 7,839,082, which is hereby incorporated by reference.

BACKGROUND OF THE INVENTION

1. Field of the Invention

The present invention relates to an organic light emitting device and a manufacturing method of the organic light emitting device.

2. Description of the Related Art

Recently, an information processing apparatus that capable of processing a large amount of data within a short time and a display device for displaying data processed by the information processing apparatus have been developed.

Generally, display devices may are classified into analog display devices and digital display devices. Cathode ray tubes (CRTs) is a representative the analog display device, and a liquid crystal display device (LCD), an organic light emitting device (OLED), and a plasma display panel (PDP) are representative the digital display devices Recently, the digital display devices having a small volume and lightweight compared to analog display devices are widely used.

Furthermore, recently, technology development for OLEDs of digital display devices is under rapid development.

A related OLED displays an image using an organic light emitting layer interposed between a pair of electrodes. Also, to display a full color image using a related art organic light emitting layer, the related art OLED includes a switching transistor, a driving transistor, and a capacitor. Also, since two transistors, a capacitor, and organic light emitting elements are formed on the same substrate, a manufacturing method thereof is complicated, and an aperture ratio of the organic light emitting layer may reduce.

To solve these disadvantages, there has developed an OLED where a switching transistor, a driving transistor, and a capacitor are formed on one substrate, while organic light emitting elements are formed on the other substrate. In detail, the switching transistor, the driving transistor, and the capacitor are disposed on a lower substrate, while the organic light emitting elements are formed on an upper substrate facing the lower substrate.

In an organic light emitting device having the above-described construction, a drive signal is transferred from a conductor connected to a driving transistor of a lower substrate to an electrode of an organic light emitting element of an upper substrate, so that an image is displayed from the organic light emitting device.

However, an image generated from an OLED where elements are formed on two substrates, respectively, may be frequently interrupted by a factor such as temperature rise, impact, vibration, and humidity absorption. The reason an image is interrupted is that a conductor connected to a driving transistor of a lower substrate is separated from an electrode of an organic light emitting element of an upper substrate as an interval between the two substrates is widened.

SUMMARY OF THE INVENTION

Accordingly, the present invention is directed to an organic light emitting device and a manufacturing method thereof that substantially obviate one or more problems due to limitations and disadvantages of the related art.

An object of the present invention is to provide an organic light emitting device that prevents elements emitting light and formed on two substrates facing each other from being separated from one another when the substrates are deformed.

Another object of the present invention is to provide a method for manufacturing an organic light emitting device having the above-described construction.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic light emitting device including a first display substrate, a second display substrate, a first adhesive force improving member, a second adhesive force improving member, and a sealing member. The first display substrate includes a first substrate, a first electrode formed on an entire surface of the first substrate, an organic light emitting pattern disposed on the first electrode, a first spacer corresponding to the organic light emitting pattern and disposed on the first electrode, a second electrode covering the organic light emitting pattern and the first spacer, a second spacer disposed on the first electrode, and a connecting member covering the second spacer and connected to the first electrode. The second display substrate includes a second substrate facing the first substrate, a first driving signal delivery part disposed on the second substrate and facing the first spacer, and a second driving signal delivery part facing the second spacer. The first adhesive force improving member couples the second electrode to the first driving signal delivery part. The second adhesive force improving member couples the first electrode to the second driving signal delivery part. The sealing member seals the first and second display substrates.

In another aspect of the present invention, there is provided a method for manufacturing an organic light emitting device, the method including: manufacturing a first display substrate by forming a first electrode over an entire surface of a first substrate, forming a first spacer on the first electrode and a second spacer separated from the first spacer, forming organic light emitting patterns corresponding to the first spacer on the first electrode, forming a second electrode covering the organic light emitting pattern and the first spacer, forming a connecting member covering a second spacer and connected to the first electrode; manufacturing a second display substrate by forming a first driving signal delivering part facing the first spacer on a second substrate facing the first substrate, and forming a second driving signal delivering part facing the second spacer; bonding the second electrode and the first driving signal delivering part using a first adhesive force improving member, and bonding the first electrode and the second driving signal delivering part using a second adhesive force improving member; and sealing the first and second display substrates using a sealing member.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. The present invention is not limited to the following embodiments but a person of ordinary skill in the art would realize the present invention in various other forms within the scope of the present invention. In the accompanying drawings, a first display substrate, a second display substrate, a first adhesive force improving member, a second adhesive force improving member, a sealing member, and other structures are exaggerated in size for clarity of the present invention. It will also be understood that when a first display substrate, a second display substrate, a first adhesive force improving member, a second adhesive force improving member, a sealing member, and other elements are referred to as being 'on' or 'under' a substrate, they may be directly 'on' or 'under' the substrate, or another first display substrate, second display substrate, first adhesive force improving member, second adhesive force improving member, sealing member, and other elements may be additionally formed on the substrate. Also, though terms like a first, a second, and a third are used to describe various regions and layers in various embodiments of the present invention, the regions and the layers are not limited to these terms. These terms are used only to tell one region or layer from another region or layer. Therefore, the terms like a first and a second may be selectively or exchangeably used for a first display substrate, a second display substrate, a first adhesive force improving member, a second adhesive force improving member, and other structures.

Organic Light Emitting Device

Figure 1:
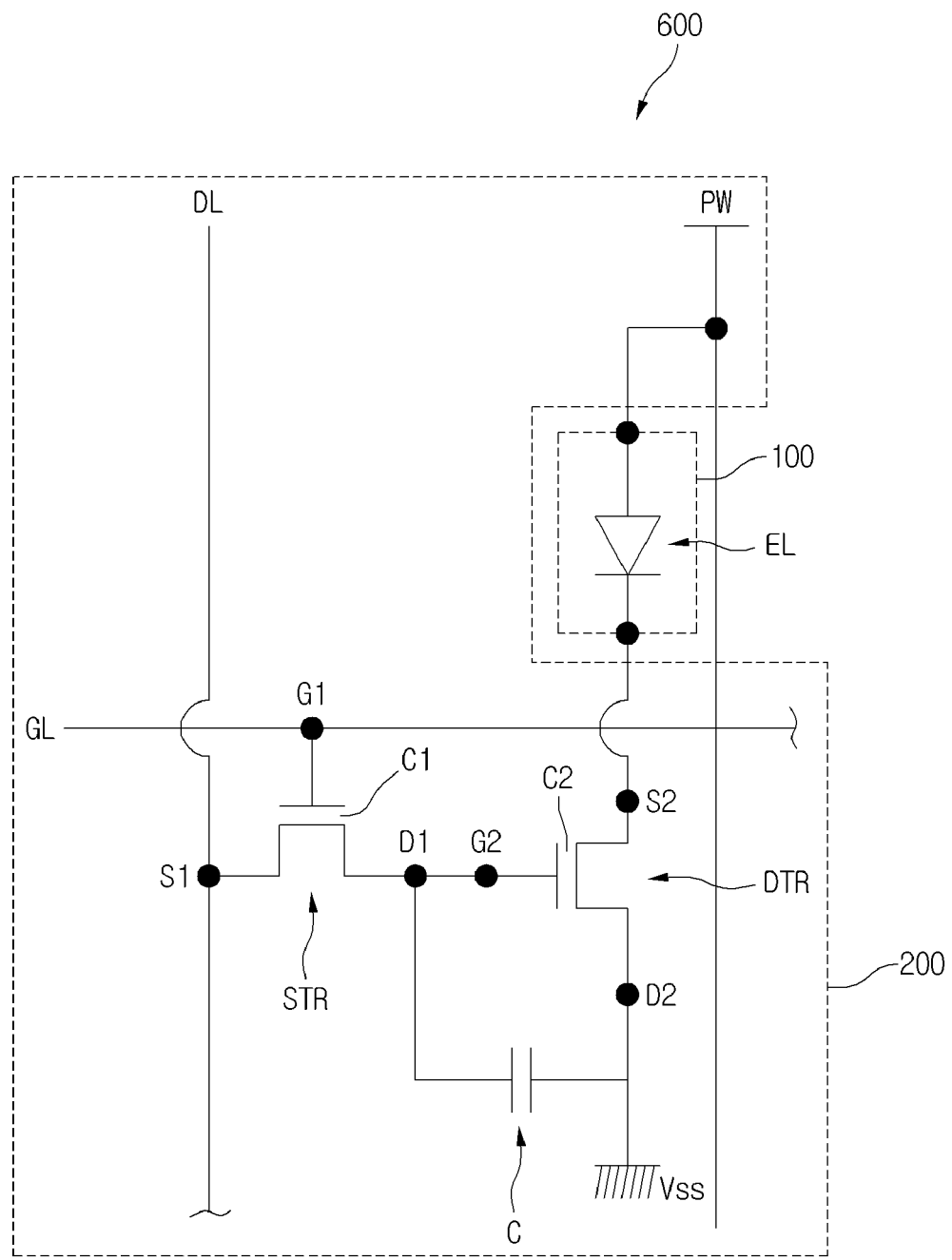
FIG. 1 is a block diagram of an organic light emitting device according to a first embodiment of the present invention.
Figure 2:
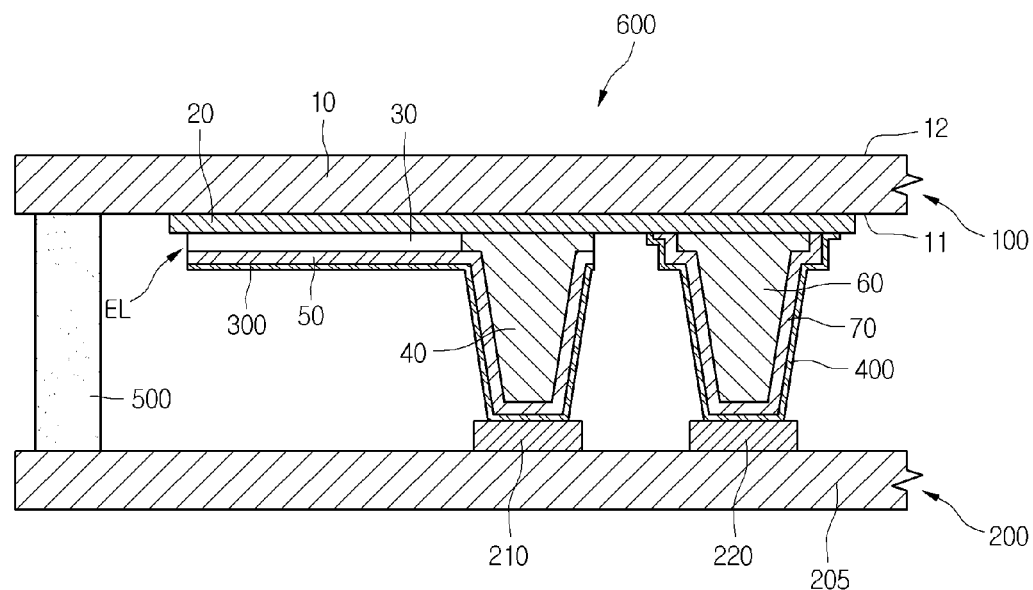
FIG. 2 is a cross-sectional view of FIG. 1.

FIG. 1 is a block diagram illustrating an organic light emitting device according to a first embodiment of the present invention. FIG. 2 is a cross-sectional view of FIG. 1.

Referring to FIG. 1, the organic light emitting device includes at least one switching transistor STR, a driving transistor DTR, a capacitor, an organic light emitting element EL, a data line DL, and a power line PW in order to display an image.

The data line DL and the gate line GL are insulated from each other by an insulating layer (not shown). For example, the gate line GL is disposed under the insulating layer, and the data line DL is disposed on the insulating layer. The gate line GL and the data line DL are disposed to substantially perpendicular to each other In a plan view. The power line PW is disposed in parallel to the data line DL.

The switching transistor STR includes a gate electrode G1, a channel layer C1, a source electrode S1, and a drain electrode D1.

The gate electrode G1 is disposed under the insulating layer and branches off from the gate line GL. The channel layer C1 is disposed on the insulating layer and formed at a position corresponding to the gate electrode G1. The source electrode S1 is disposed on the insulating layer. The source electrode S1 branches off from the data line DL. An end portion of the source electrode S1 is electrically contacted to the channel layer C1. The drain electrode D1 is disposed on the insulating layer and electrically contacted to the channel layer C1. The source electrode S1 and the drain electrode D1 are spaced apart from each other by a predetermined distance.

The driving transistor DTR includes a gate electrode G2, a channel layer C2, a source electrode S2, and a drain electrode D2.

The gate electrode G2 is disposed under the insulating layer and electrically connected to the drain electrode D1 of the switching transistor STR. The channel layer C1 is disposed on the insulating layer and formed at a position corresponding to the gate electrode G2. The source electrode S2 is disposed on the insulating layer. A first end portion of the source electrode S2 is electrically contacted to the channel layer C2, and a second end portion opposite to the first end portion is electrically connected to the power line PW. A first end portion of the drain electrode D2 is disposed on the channel layer C2. The first end portion of the drain electrode D2 is spaced apart from the first end portion of the source electrode S2. A second end portion of the drain electrode D2 is connected earth potentials.

A pair of electrodes of a capacitor is electrically connected to the drain electrode D1 of the switching transistor STR and the drain electrode D2 of the driving transistor DTR, respectively.

The organic light emitting element EL is electrically connected to the source electrode S2 of the driving transistor DTR.

Referring to FIGS. 1 and 2, elements of the organic light emitting device 600 descried with reference to FIG. 1 are formed on a first display substrate 100 and a second display substrate 200, respectively. Meanwhile, the organic light emitting device 600 includes a first adhesive force improving member 300 and a second adhesive force improving member 400 for improving adhesive force between elements distributed on the first and second display substrates 100 and 200.

The elements formed on the first display substrate 100 are described below.

Referring to FIGS. 1 and 2, the organic light emitting element EL is formed on the first display substrate 100. The switching transistor STR, the driving transistor DRT, a capacitor C, the data line DL, the gate line GL, and the power line PW are formed on the second display substrate 200 as illustrated in FIG. 1.

The organic light emitting element EL formed on the first display substrate 100 includes a first substrate 10, a first electrode 20, organic light emitting patterns 30, a first spacer 40, a second electrode 50, a second spacer 60, and a connecting member 70.

The first substrate 10 includes a transparent substrate, for example. In detail, the first substrate 10 may be a glass substrate having a plate shape. One face of the first substrate 10 that faces the second display substrate 200 is defined as a first face 11. The other face of the first substrate 10 that faces the first face 11 is defined as a second face 12.

The first electrode 20 is disposed on the first face of the first substrate 10. In the present embodiment, the first electrode 20 includes a transparent conductive material. Examples of a material that may be used as the first electrode 20 include Indium Tin Oxide (ITO), Indium Zinc Oxide (IZO), and amorphous Indium Tin Oxide (a-ITO), etc. In the present embodiment, the first electrode 20 is formed over an entire area of the first face 11 of the first substrate 10.

Figure 3:
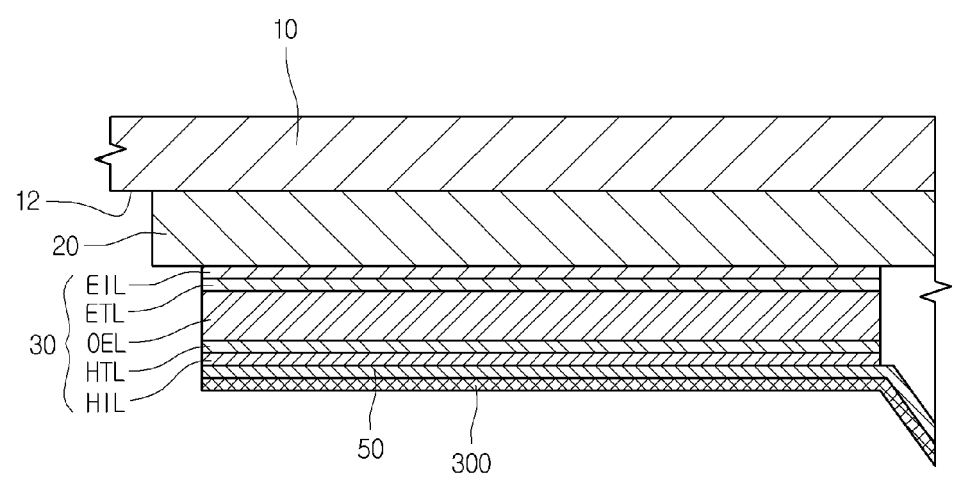
FIG. 3 is a detailed cross-sectional view of the organic light emitting patterns of FIG. 2.

FIG. 3 is a detailed cross-sectional view of the organic light emitting patterns of FIG. 2.

Referring to FIG. 3, the organic light emitting patterns 30 are disposed on the first electrode 20. The plurality of organic light emitting patterns 30 may be disposed on the first electrode 20 in a matrix shape. To dispose the organic light emitting patterns 30 in a matrix shape, a partition wall (not shown) having a lattice shape may be disposed on the first electrode 20.

The organic light emitting patterns 30 may include a hole injection layer (HIL), a hole transport layer (HTL), an organic electroluminescent layer (OEL), an electron transport layer (ETL), and an electron injection layer (EIL). The organic light emitting patterns 30 according to the present embodiment may be formed by a vacuum deposition method, for example.

Referring again to FIG. 2, the first spacer 40 may be disposed on the first electrode 20. In detail, the first spacer includes an insulating material, and is disposed at an adjacent position to each organic light emitting pattern 30.

The second electrode 50 is disposed on the organic light emitting patterns 30 and the first spacer 40 located at a position close to the organic light emitting patterns 30. In the present embodiment, the second electrode 50 includes a conductor having a relatively small work function compared to that of the first electrode 20. In the present embodiment, examples of a material that may be used as the second electrode 50 include aluminum and an aluminum alloy, etc. The second spacer 60 is disposed on the first electrode 20. The second spacer 60 is disposed at a position spaced apart from the first spacer 40. In the present embodiment, heights of the first and second spacers 40 and 60 measured from the first electrode 20 are substantially the same.

The connecting member 70 covers the second spacer 60 and the connecting member 70 is electrically connected to the first electrode 20. In the present embodiment, examples of a material that may be used as the connecting member 70 include aluminum and an aluminum alloy, etc.

Elements disposed on the second display substrate 200 are described below.

Referring again to FIG. 2, the switching transistor STR, the driving transistor DRT, a capacitor C, the data line DL, the gate line GL, and the power line PW are formed on the second display substrate 200 as described in detail with reference to FIG. 1.

A first driving signal delivery part 210, which is a portion of the source electrode S2 of the driving transistor DTR disposed on the second display substrate 200 is disposed to face the first spacer 40. A second driving signal delivery part 220, which is a portion of the power line PW, is disposed to face the second spacer 60.

In detail, the first driving signal delivery part 210, which is a portion of the source electrode S2 of the driving transistor DTR is electrically connected to the second electrode covering the first spacer 40. The second driving signal delivery part 220, which is a portion of the power line PW, is electrically connected to the connecting member 70 covering the second spacer 60.

An operation of the organic light emitting device 600 including elements distributed over the first and second display substrates 100 and 200 will be briefly described with reference to FIGS. 1 and 2.

First, a driving signal for displaying an image is applied via the data line DL, so that a drive signal is applied to the source electrode S1 of the switching transistor STR. Subsequently, a turn-on signal for turning on the switching transistor STR is applied to the gate line GL, so that the driving signal applied to the source electrode S1 is provided to the drain electrode D1 via the channel layer C1 where a channel is formed.

The driving signal provided to the drain electrode D1 is applied to the gate electrode G2 of the driving transistor DTR to form a channel at the channel layer C2 of the driving transistor DTR and simultaneously charges the capacitor C.

Meanwhile, since a second driving signal delivery part 220, which is a portion of the power line PW, is connected to the conductive connecting member 70 covering the second spacer 60, power is applied to the first electrode 20 of the first display substrate 100 from the second display substrate 200 via the power line PW.

Therefore, in the case that a channel is formed in the channel layer C2 of the driving transistor DTR, a forward current is applied to the organic light emitting element EL, so that light is emitted from the organic light emitting element EL.

The first adhesive force improving member 300 not only electrically connects the second electrode 50 of the first display substrate 100 to the first driving signal delivery part 210 of the second display substrate 200, but also solidly couples the second electrode 50 to the first driving signal delivery part 210 physically and chemically. In detail, the first adhesive force improving member 300 may be molten to couple to the second electrode 50 and the first driving signal delivery part 210. Particularly, the first adhesive force improving member 300 prevents the second electrode 50 and the first driving signal delivery part 210 from being separated from each other even when an interval between the first and second display substrates 100 and 200 is widened due to twisting, impact, vibration, and thermal expansion caused by temperature rise.

In the present embodiment, the first adhesive force improving member 300 may be formed of metal of a low melting point molten at a temperature range of about 300° C. to about 450° C. Examples of metal of a low melting point that may be used as the first adhesive force improving member 300 include In, Zn, Pb, Ca, Mg, and Sn, etc.

Referring again to FIG. 2, the first adhesive force improving member 300 may entirely cover the second electrode 50. The second adhesive force improving member 400 not only electrically connect the connecting member 70 of the first display substrate 100 to the second driving signal delivery part 220 of the second display substrate 200, but also solidly couples them physically and chemically. In detail, the second adhesive force improving member 400 is molten to electrically connect the connecting member 70 to the second driving signal delivery part 220. The second adhesive force improving member 400 prevents the connecting member 70 and the second driving signal delivery part 220 from being separated from each other even when an interval between the first and second display substrates 100 and 200 is widened due to twisting, impact, vibration, and thermal expansion caused by temperature rise.

In the present embodiment, the second adhesive force improving member 400 may be formed of metal of a low melting point molten at a temperature range of about 300° C. to about 450° C. Examples of metal of a low melting point that may be used as the second adhesive force improving member 400 include In, Zn, Pb, Ca, Mg, and Sn, etc.

Referring again to FIG. 2, the second adhesive force improving member 300 may entirely cover the connecting member 70.

A sealing member 500 is interposed between the first display substrate 100 and the second display substrate 200 to prevent harmful materials such as oxygen, moisture, and hydrogen from penetrating between the first and second display substrates 100 and 200.

A porous member capable of adsorbing harmful materials using plurality of holes may be mixed into the sealing member 500 according to the present embodiment.

Figure 4:
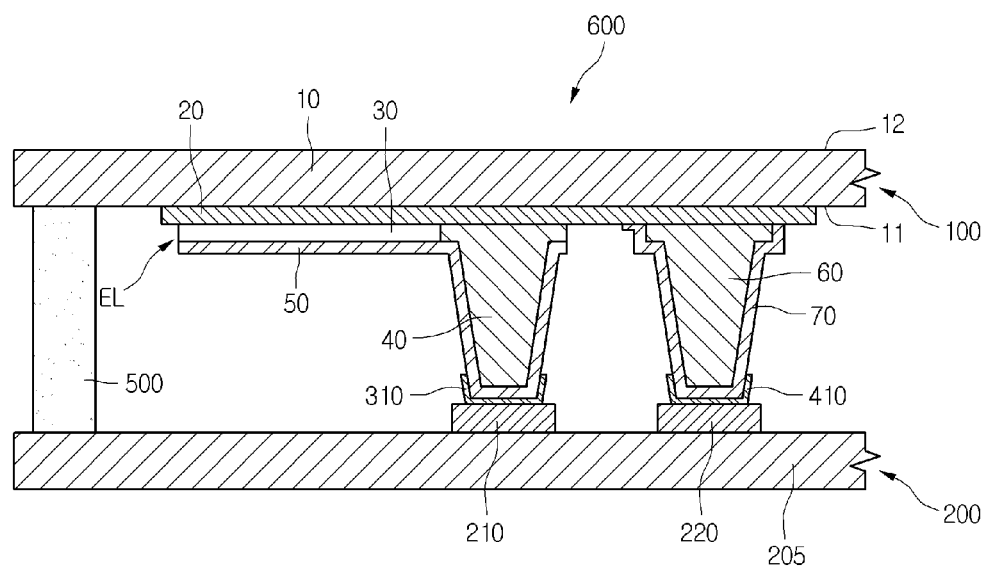
FIG. 4 is a cross-sectional view of an organic light emitting device according to a second embodiment of the present invention.

FIG. 4 is a cross-sectional view of an organic light emitting device according to a second embodiment of the present invention. An organic light emitting device according to the second embodiment of the present invention has substantially the same construction of the above-described organic light emitting device according to the first embodiment except the first and second adhesive force improving members. Therefore, same names and reference numerals are used for the same construction as that of the first embodiment.

Referring to FIGS. 1 and 4, the organic light emitting device 600 includes a first display substrate 100 including an organic light emitting element EL, and a second display substrate 200 including a switching transistor STR, a driving transistor DTR, a capacitor, a data line DL, a gate line GL, and a power line PW.

Also, the organic light emitting device 600 further includes a first adhesive force improving member 310 and a second adhesive force improving member 410.

In the present embodiment, the first adhesive force improving member 310 may be disposed between the second electrode 50 and a first driving signal delivery part 210. Also, the second adhesive force improving member 410 may be locally disposed between a connecting member 70 and a second driving signal delivery part 220.

In detail, the first adhesive force improving member 310 may be locally disposed on an upper end of the protruding second electrode 50 that corresponds to a first spacer 40. The second adhesive force improving member 410 may be locally disposed on an upper end of the connecting member 70 that corresponds to the second spacer 60.

Figure 5:
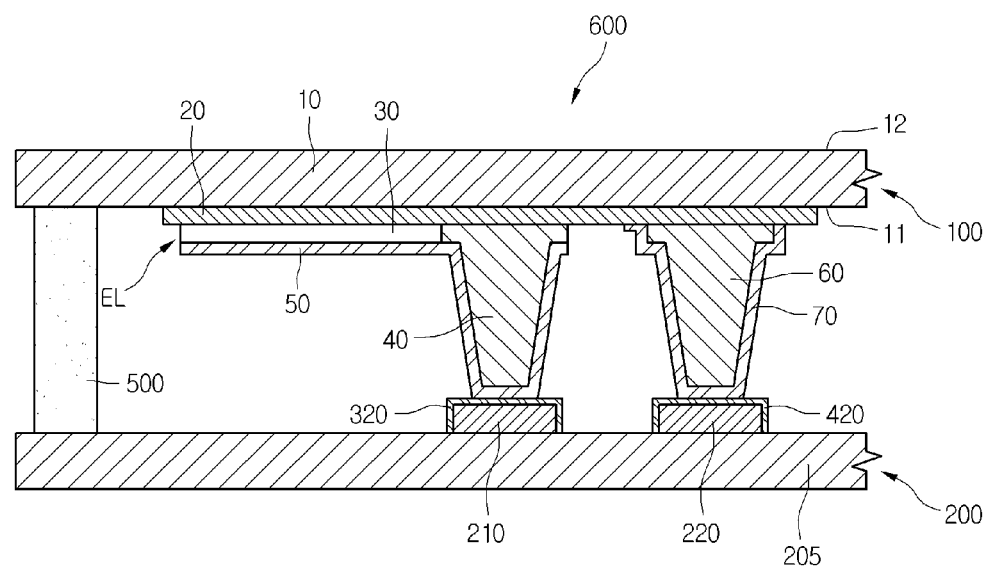
FIG. 5 is a cross-sectional view of an organic light emitting device according to a third embodiment of the present invention.

FIG. 5 is a cross-sectional view of an organic light emitting device according to a third embodiment of the present invention. The organic light emitting device according to the third embodiment of the present invention has substantially the same construction of the above-described organic light emitting device according to the second embodiment except the first and second adhesive force improving members. Therefore, same names and reference numerals are used for the same construction as that of the second embodiment.

Referring to FIGS. 1 and 5, the organic light emitting device 600 includes a first display substrate 100 including an organic light emitting element EL, and a second display substrate 200 including a switching transistor STR, a driving transistor DTR, a capacitor, a data line DL, a gate line GL, and a power line PW.

Also, the organic light emitting device 600 further includes a first adhesive force improving member 320 and a second adhesive force improving member 420.

In the present embodiment, the first adhesive force improving member 320 may be locally disposed on an upper surface of a first driving signal delivery part 210, which is a portion of a source electrode S2 of the drain transistor DTR disposed on the second display substrate 200. Unlike this, the first adhesive force improving member 320 may completely cover the surface of the first driving signal delivery part 210. Also, the second adhesive force improving member 420 is disposed to face a second spacer 60, and locally disposed on an upper surface of the second driving signal delivery part 220, which is a portion of the power line PW. Unlike this, the second adhesive force improving member 420 may completely cover the surface of the second driving signal delivery part 220.

Method for Manufacturing Organic Light Emitting Device

Figure 6:
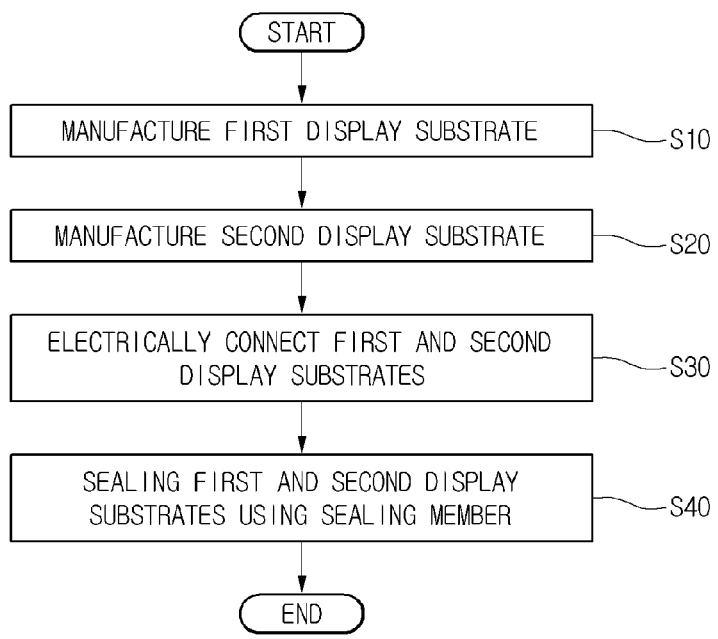
FIG. 6 is a flowchart illustrating a method for manufacturing an organic light emitting device according to a fourth embodiment of the present invention.

FIG. 6 is a flowchart illustrating a method for manufacturing an organic light emitting device according to a fourth embodiment of the present invention, and FIGS. 7 to 10 are cross-sectional views illustrating a process for manufacturing a first display substrate.

Referring to FIG. 6, a first display substrate 100 is manufactured in order to manufacture an organic light emitting device in S10. Of course, a second display substrate in S20, which will be described later, may be manufactured prior to the first display substrate.

Figure 7:
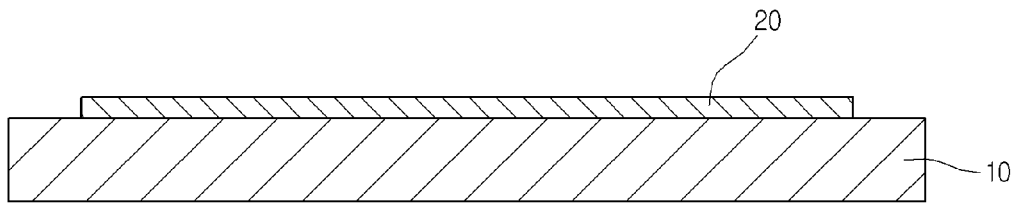
FIGS. 7 to 10 are cross-sectional views illustrating a process for manufacturing a first display substrate.

Referring to FIGS. 6 and 7, a first electrode 20 is formed on an entire surface of the first substrate 10. In the present embodiment, the first substrate 10 may be a transparent glass substrate, for example. To form the first electrode 20, a transparent conductive layer (not shown) is formed on an entire surface of the first substrate 10. The transparent conductive layer may be formed on the first substrate 10 using chemical vapor deposition (CVD) or sputtering. After formed on the first substrate 10, the transparent conductive layer is patterned using photolithography to form the transparent and conductive first electrode 20 on the first substrate 10.

Figure 8:
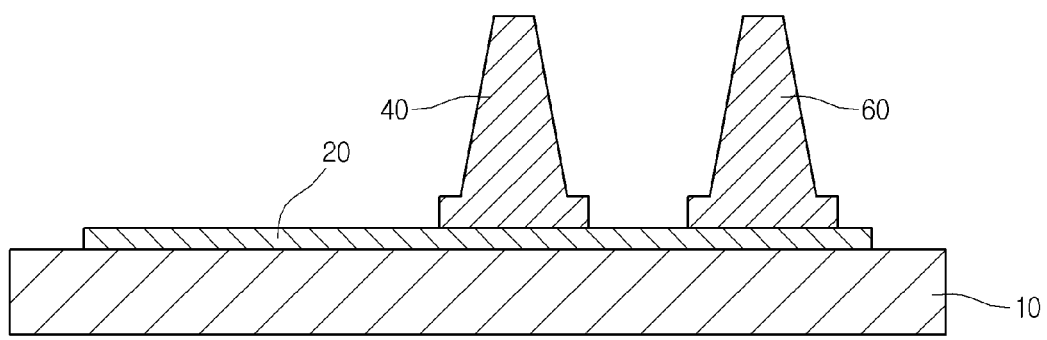

Referring to FIG. 8, after the first electrode 20 is formed on the first substrate 10, a first spacer 40 and a second spacer 60 separated from the first spacer 40 are formed on the first electrode 20.

To form the first spacer 40 and the second spacer 60, a thin insulating layer (not shown) covering the first electrode 20 is formed on the first substrate 10. In the present embodiment, the insulating layer may include an organic material including photoresist.

The thin insulating layer covering the first electrode is patterned using photolithography including an exposure process and a developing process to simultaneously form the first spacer 40 and the second spacer 60 protruding from the first substrate 10 on the first substrate 10.

In the present embodiment, since the first spacer 40 and the second spacer 60 are formed by patterning the insulating layer, they have substantially the same height. In the present embodiment, the first spacer 40 is formed at every position corresponding to a plurality of organic light emitting patterns, which will be described below.

Figure 9:
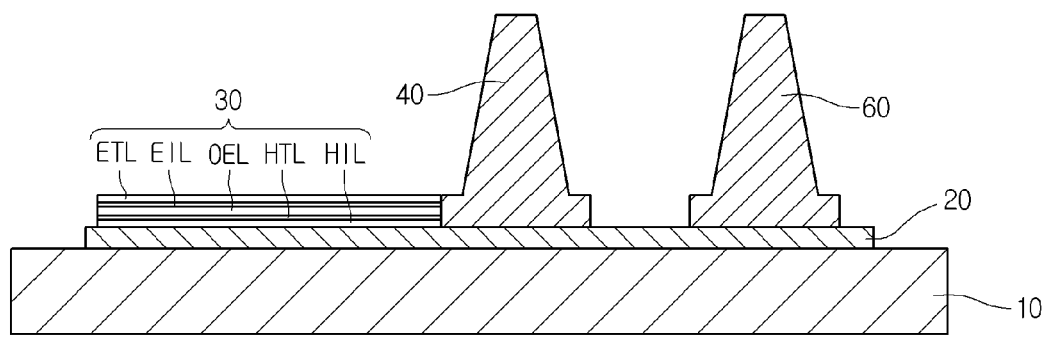

Referring to FIG. 9, after the first and second spacers 40 and 60 are formed on the first electrode 20, organic light emitting patterns 30 are formed on the first electrode 20.

In the present embodiment, an EIL is formed on the first electrode 20, an ETL is formed on the EIL, an organic electroluminescent layer OEL is formed on the ETL, an HTL is formed on the OEL, and a HIL is formed on the HTL, so that the organic light emitting patterns 30 are manufactured. In the present embodiment, the first electrode 20 provides electrons to the EIL.

Figure 10:
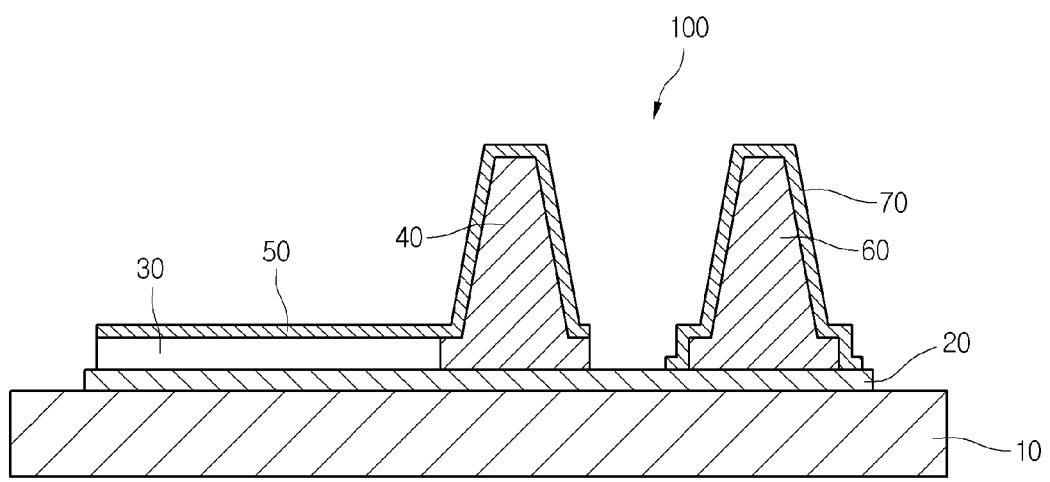

Referring to FIG. 10, after the organic light emitting patterns 30 is manufactured, a metal layer (not shown) having a small work function compared to that of the first electrode 10 is formed over an entire surface of the first substrate 10 to cover the organic light emitting patterns 30. In the present embodiment, the metal layer is formed using sputtering. Examples of a material that is used as the metal layer include aluminum and an aluminum alloy.

Subsequently, the metal layer is etched using photolithography to form a second electrode 50 and a connecting member 70 on the first substrate 10. In the present embodiment, the second electrode 50 is insulated from the first electrode 20, and covers the organic light emitting patterns 30 and the first spacer 40. The connecting member 70 covers the second spacer 40 and is electrically connected to the first electrode 20. Through the above process, the first display substrate 100 is manufactured. In the present embodiment, the second electrode 50 and the connecting member 70 are electrically insulated when they are etched using photolithography.

Figure 11:
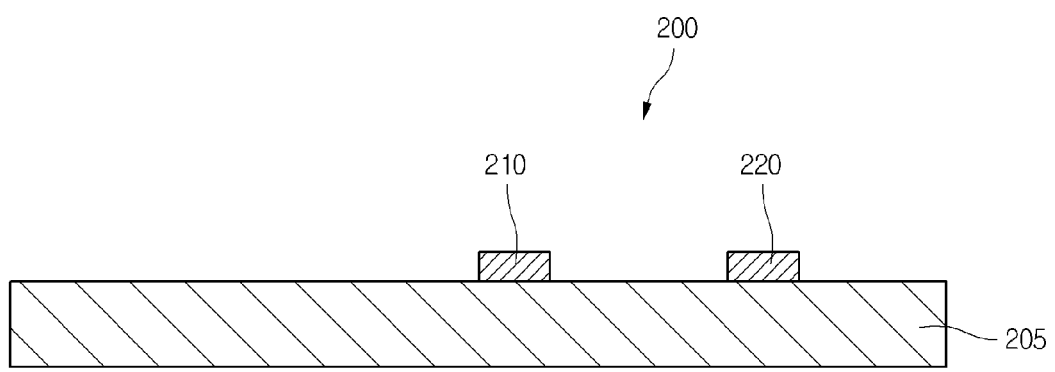
FIG. 11 is a cross-sectional view explaining manufacturing of a second display substrate according to a fourth embodiment of the present invention.

FIG. 11 is a cross-sectional view explaining manufacturing of a second display substrate according to a fourth embodiment of the present invention.

Referring to FIGS. 1, 6, and 11, the switching transistor STR, the driving transistor DTR, the capacitor, the data line DL, the gate line GL, and the power line PW are formed on the second substrate 205 in S20 as described with reference to FIG. 1.

A first driving signal delivery part 210, which is a portion of the source electrode S1 of the driving transistor DTR, is formed on the second substrate 205 to face the first spacer 40. A second driving signal delivery part 220, which is a portion of the power line PW, is disposed to face the second spacer 60. Through the above process, the second display substrate 200 is manufactured.

Figure 12:
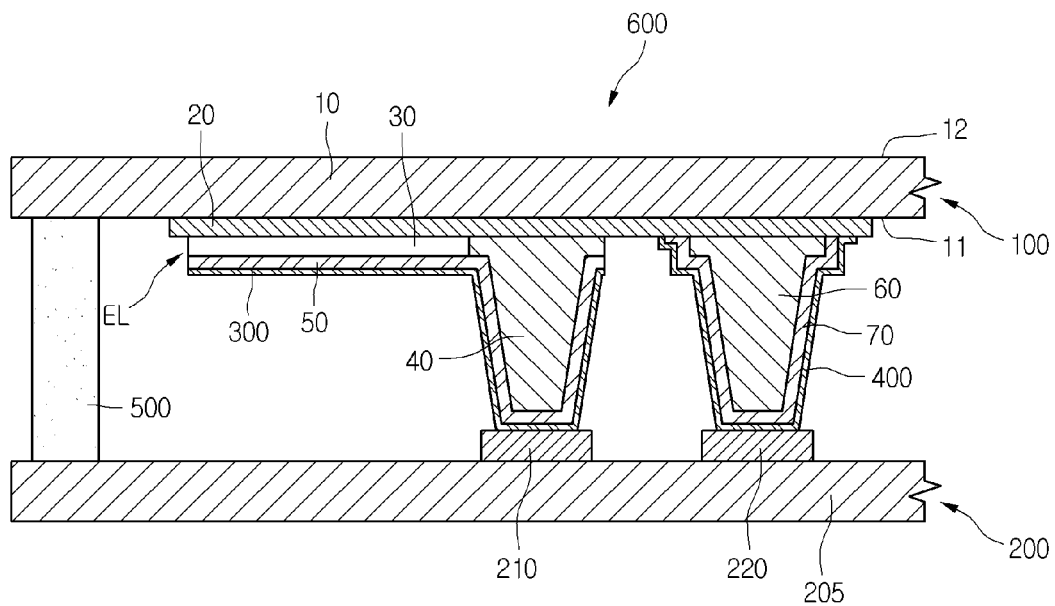
FIG. 12 is a cross-sectional view explaining elements of a first display substrate are electrically connected to elements of a second display substrate according to a fourth embodiment of the present invention.

FIG. 12 is a cross-sectional view explaining elements of a first display substrate are electrically connected to elements of a second display substrate according to a fourth embodiment of the present invention.

Referring to FIGS. 1, 6, and 12, a first adhesive force improving member 300 is formed on the second electrode 50, and a second adhesive force improving member 400 is formed on the connecting member 70 to electrically connect and physically couple the second electrode 50 and the connecting member 70, which are the elements of the first display substrate, to the first driving signal delivery part 210 and the second driving signal delivery part 220, which are the elements of the second display substrate in S30.

In the present embodiment, each of the first and second adhesive force improving members 300 and 400 includes metal of a low melting point that is molten at a temperature range of about 300-450° C. In the present embodiment, examples of a material that may be used as the first and second adhesive force improving members 300 and 400 include In, Zn, Pb, Ca, Mg, and Sn.

In the present embodiment, the first and second adhesive force improving members 300 and 400 may be selectively formed on the second electrode 50 and the connecting member 70 through evaporation using a shadow mask, for example.

In the present embodiment, the first and second adhesive force improving members 300 and 400 may be formed over entire surfaces of the second electrode 50 and the connecting member 70 of the first display substrate 100, for example. Unlike this, the first and second adhesive force improving members 300 and 400 may be selectively formed only on a surface of the second electrode 50 of the first display substrate 100, and portions of the connecting member 70 that contact the first and second driving signal delivery parts 210 and 220. Unlike this, the first and second adhesive force improving members 300 and 400 may be formed on the first and second driving signal delivery parts 210 and 220 of the second display substrate 200.

After the first and second adhesive force improving members 300 and 400 are formed on the second electrode 50 and the connecting member 70, a sealing member 500 is disposed on an edge of the second display substrate 200. Subsequently, the first adhesive force improving member 300 of the first display substrate 100 contacts the first driving signal delivery part 210 of the second display substrate 200, and the second adhesive force improving member 300 of the first display substrate 100 contacts the second driving signal delivery part 210 of the second display substrate 200.

Subsequently, the first and second display substrates 100 and 200 are heated to a temperature range of about 300-450° C., so that the first and second adhesive force improving members 300 and 400 disposed on the second electrode 50 and the connecting member 70 of the first display substrate 100 are molten. Through the above process, the second electrode 50 of the first display substrate 100 is electrically connected and physically coupled to the first driving signal delivery part 210 of the second display substrate 200. The connecting member 70 of the first display substrate 100 is electrically connected and physically coupled to the second driving signal delivery part 220 of the second display substrate 200.

As described above in detail, two display substrates are not separated from each other when elements of an organic light emitting device are distributed on the two display substrates, so that interruption of an image is prevented.

It will be apparent to those skilled in the art that various modifications and variations may be made in the present invention. Thus, it is intended that the present invention covers the modifications and variations of this invention provided they come within the scope of the appended claims and their equivalents.

What is claimed is:

1. A method for manufacturing an organic light emitting device, the method comprising:

manufacturing a first display substrate by forming a first electrode over an entire surface of a first substrate, forming a first spacer and a second spacer separated from the first spacer on the first electrode, forming organic light emitting patterns corresponding to the first spacer on the first electrode, forming a second electrode covering the organic light emitting patterns and the first spacer, forming a connecting member covering a second spacer and connected to the first electrode;

manufacturing a second display substrate by forming a first driving signal delivering part facing the first spacer on a second substrate facing the first substrate, and forming a second driving signal delivering part facing the second spacer;

bonding the second electrode and the first driving signal delivering part using a first adhesive force improving member, and bonding the connecting member and the second driving signal delivering part using a second adhesive force improving member; and sealing the first and second display substrates using a sealing member.

2. The method according to claim 1, wherein the first adhesive force improving member is formed on a surface of the second electrode, and the second adhesive force improving member is formed on a surface of the connecting member.

3. The method according to claim 1, wherein the first and second adhesive force improving members are formed using evaporation.

4. The method according to claim 1, wherein each of the first and second adhesive force improving members includes one selected from the group consisting of In, Zn, Pb, Ca, Mg, and Sn.

5. The method according to claim 1, wherein the bonding of the second electrode and the first driving signal delivery part using the first adhesive force improving member, and the bonding of the connecting member and the second driving signal delivery part using the second adhesive force improving member comprises heating the first and second adhesive force improving members at a temperature range of about 300-450° C.

* * * * *